US 6,608,352 B1

(12) United States Patent
Long et al.

(10) Patent No.: US 6,608,352 B1
(45) Date of Patent: Aug. 19, 2003

(54) DETERMINATION OF THERMAL RESISTANCE FOR FIELD EFFECT TRANSISTOR FORMED IN SOI TECHNOLOGY

(75) Inventors: Wei Long, Sunnyvale, CA (US); Michael Lee, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/131,904

(22) Filed: Apr. 25, 2002

Related U.S. Application Data

(62) Division of application No. 09/846,969, filed on May 1, 2001, now Pat. No. 6,423,604.

(51) Int. Cl.[7] .................. H01L 27/01; H01L 27/12; H01L 31/0392
(52) U.S. Cl. .................. 257/347; 257/288; 257/929
(58) Field of Search .................. 257/192, 197, 257/212, 213, 288, 296, 347, 367, 401, 487, 544, 557, 565, 580, 582, 595, 929

(56) References Cited

U.S. PATENT DOCUMENTS 6,043,536 A * 3/2000 Numata et al. ............. 257/347
6,423,604 B1 * 7/2002 Long et al. ................. 438/311

* cited by examiner

Primary Examiner—David Nhu
(74) Attorney, Agent, or Firm—Monica H. Choi

(57) ABSTRACT

In a system for determining thermal resistance of a field effect transistor, a p-n junction is formed with one of drain and source regions of the transistor for determining a current versus temperature characteristic of the p-n junction. A respective temperature of the transistor is determined for each of a plurality of power dissipation levels through the transistor from the current versus temperature characteristic of the p-n junction. The thermal resistance is a rate of change of the temperature with respect to a rate of change of the power dissipation level for the field effect transistor.

14 Claims, 6 Drawing Sheets

DETERMINATION OF THERMAL RESISTANCE FOR FIELD EFFECT TRANSISTOR FORMED IN SOI TECHNOLOGY

This is a divisional of an earlier filed patent application, with Ser. No. 09/846,969 filed on May 1, 2001, now U.S. Pat. No. 6,423,604 issued Jul. 23, 2000 for which priority is claimed. This earlier filed copending patent application with Ser. No. 09/846,969 is in its entirety incorporated herewith by reference.

TECHNICAL FIELD

The present invention relates generally to fabrication of field effect transistors having scaled-down dimensions, and more particularly, to a system for determining the thermal resistance of a field effect transistor formed in SOI (semiconductor on insulator) technology.

BACKGROUND OF THE INVENTION

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down further, the junction capacitances formed by the drain and source extension junctions 104 and 106 and by the drain and source contact junctions 108 and 112 may limit the speed performance of the MOSFET 100. Thus, referring to FIG. 2, a MOSFET 150 is formed with SOI (semiconductor on insulator) technology. In that case, a layer of buried insulating material 152 is formed on the semiconductor substrate 102, and a layer of semiconductor material 154 is formed on the layer of buried insulating material 152. A drain region 156 and a source region 158 of the MOSFET 150 are formed in the layer of semiconductor material 154. Elements such as the gate dielectric 116 and the gate electrode 118 having the same reference number in FIGS. 1 and 2 refer to elements having similar structure and function. Processes for formation of such elements 116, 118, 152, 154, 156, and 158 of the MOSFET 150 are known to one of ordinary skill in the art of integrated circuit fabrication.

In FIG. 2, the drain region 156 and the source region 158 are formed to extend down to contact the layer of buried insulating material 152. Thus, because the drain region 156, the source region 158, and a channel region 160 of the MOSFET 150 do not form a junction with the semiconductor substrate 102, junction capacitance is minimized for the MOSFET 150 to enhance the speed performance of the MOSFET 150 formed with SOI (semiconductor on insulator) technology, as known to one of ordinary skill in the art of integrated circuit fabrication.

The buried insulating material 152 is comprised of a dielectric material such as silicon dioxide ($SiO_2$) according to one embodiment of the present invention. The buried insulating material 152 has lower heat conductivity (about 100 times lower) than semiconductor material such as silicon for example. During operation of the MOSFET 150, the MOSFET 150 dissipates power as the MOSFET 150 is biased to conduct current. Such dissipation of power heats up the layer of semiconductor material 154. Because the buried insulating material 152 has lower heat conductivity, the power dissipated by the MOSFET 150 builds up within the layer of semiconductor material 154, and the layer of semiconductor material 154 may heat up to temperatures that degrade the performance of the MOSFET 150 according to the SHE (Self Heating Effect), as known to one of ordinary skill in the art of integrated circuit fabrication.

For designing integrated circuits having the MOSFET 150 formed in SOI (semiconductor on insulator) technology, the SHE (Self Heating Effect) is typically modeled with a thermal resistance $R_{th}$, as known to one of ordinary skill in the art of integrated circuit fabrication. The thermal resistance $R_{th}$ is the rate of change in temperature of the layer of semiconductor material 154, $\Delta T$, with respect to a rate of change in power dissipation, $\Delta W$, by the MOSFET 150, as known to one of ordinary skill in the art of integrated circuit fabrication:

$$R_{th} = \Delta T/\Delta W$$

The prior art mechanisms for determining the self heating effect, as described in *Measurement of I–V Curves of Silicon-on-Insulator (SOI) MOSFET's Without Self-Heating*, by K. A. Jenkins and J. Y.-C Sun, IEEE Electron Device Letters, Vol. 16, No. 4, April 1995 or *Self-Heating Effects in SOI MOSFET's and Their Measurement by Small Signal Conductance Techniques* by Bernard M. Tenbroek et al., IEEE Transactions on Electron Devices, Vol. 43, No. 12, December 1996, use a pulse technique or a small signal conductance technique that are relatively complicated and time-consuming. Nevertheless, the thermal resistance $R_{th}$ is a parameter that is used for designing integrated circuits having MOSFETs in SOI (semiconductor on insulator) technology. Thus, a mechanism is desired for determining the thermal resistance $R_{th}$ of a MOSFET formed in SOI (semiconductor on insulator) technology in an easy yet accurate manner.

SUMMARY OF THE INVENTION

Accordingly, in a general aspect of the present invention, a p-n junction is formed from a drain region or a source region of a field effect transistor formed with a semiconductor film on a buried insulating layer in SOI (semiconductor on insulator) technology. The current versus temperature characteristic of the p-n junction is determined. From such a current versus temperature characteristic, the temperature of the field effect transistor at various power dissipation levels is determined. The thermal resistance $R_{th}$ parameter for the field effect transistor is determined to be the rate of change of the temperature of the field effect transistor with respect to the rate of change of power dissipation level of the field effect transistor.

In one embodiment of the present invention, the thermal resistance $R_{th}$ parameter is determined for a field effect transistor formed with a semiconductor film on a buried insulating material in SOI (semiconductor on insulator) technology. A p-n junction is formed with one of a drain region or a source region of the field effect transistor. The p-n junction is biased at a bias voltage. The p-n junction is heated to a plurality of temperatures. A current conducted through the p-n junction is measured at each of the plurality of temperatures of the p-n junction to generate a current versus temperature characteristic for the p-n junction.

A respective current flowing through the p-n junction is measured as the field effect transistor is biased to dissipate each of a plurality of power dissipation levels and with the p-n junction being biased at the bias voltage. The respective temperature of the p-n junction is determined from the measured respective current and the current versus temperature characteristic for each of the plurality of power dissipation levels. The thermal resistance is determined to be the rate of change of temperature with respect to the rate of change of power dissipation level.

The present invention may be used to particular advantage when the p-n junction is formed with one of the drain region or the source region having a higher electric field during operation of the field effect transistor.

In this manner, the p-n junction is biased with a DC bias voltage, and the field effect transistor is biased at various DC bias voltages. Thus, the thermal resistance $R_{th}$ parameter for the field effect transistor is determined by using simple DC bias voltages such that the thermal resistance $R_{th}$ parameter is determined in a relatively easy manner.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 2:
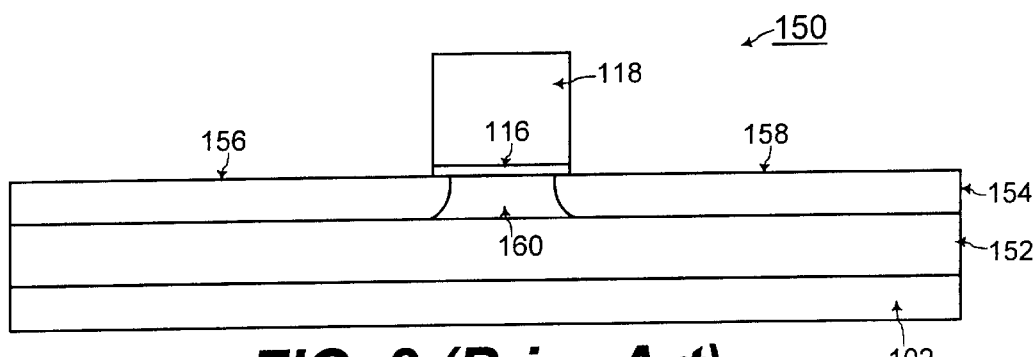
FIG. 2 shows a cross-sectional view of a MOSFET (Metal Oxide Semiconductor Field Effect Transistor) fabricated using a thin semiconductor layer on a buried insulating layer in SOI (semiconductor on insulator) technology, according to the prior art.
Figure 3:
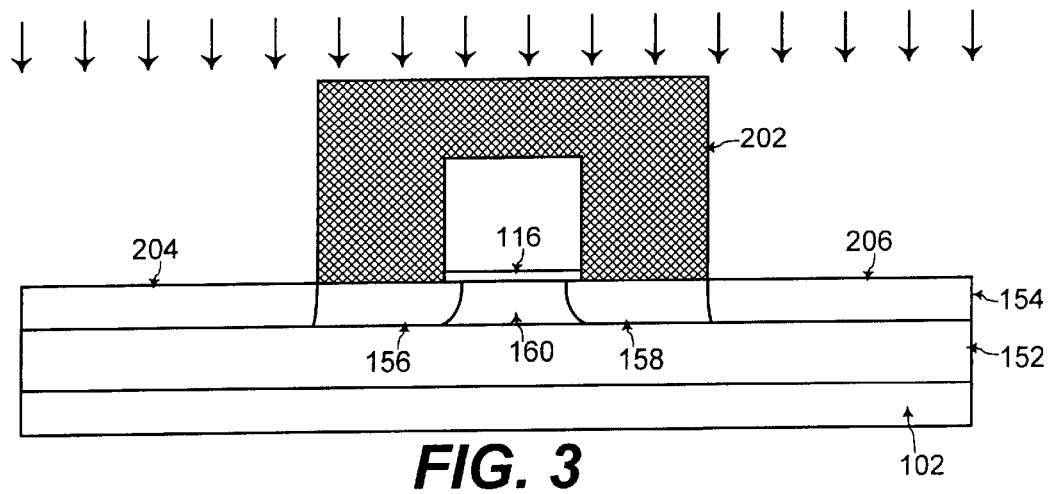
FIG. 3 shows a cross-sectional view for showing the step of forming a p-n junction with a drain region and a source region of a MOSFET (Metal Oxide Semiconductor Field Effect Transistor) fabricated using a thin semiconductor layer on a buried insulating layer in SOI (semiconductor on insulator) technology, according to an embodiment of the present invention.

In the cross-sectional view of FIG. 3, an embodiment of the present invention starts with the MOSFET (Metal Oxide Semiconductor Field Effect Transistor) 150 formed in SOI (semiconductor on insulator) technology, as illustrated in FIG. 2. Further referring to FIG. 3, for forming a p-n junction according to an embodiment of the present invention, a masking structure 202 is formed over the gate electrode 118 and over portions of the drain region 156 and the source region 158. The masking structure 202 is comprised of photoresist material according to one embodiment of the present invention, and processes for patterning such masking structure 202 are known to one of ordinary skill in the art of integrated circuit fabrication.

A p-n junction dopant is implanted into exposed portions of the layer of semiconductor material 154 to form a first doped region 204 and a second doped region 206. When the MOSFET 150 is an NMOSFET (N-channel Metal Oxide Semiconductor Field Effect Transistor), the drain region 156 and the source region 158 are doped with an N-type dopant, such as phosphorous or arsenic for example. Referring to FIG. 3, for forming the p-n junction with the drain or source regions 156 and 158, a P-type dopant such as boron is implanted into the exposed first doped region 204 and the second doped region 206. The first doped region 204 being doped with a P-type dopant and the drain region 156 being doped with an N-type dopant forms a first p-n junction. The second doped region 206 being doped with a P-type dopant and the source region 158 being doped with an N-type dopant forms a second p-n junction.

As known to one of ordinary skill in the art of electronics, the current characteristic of a p-n junction is expressed as follows:

$$I_{p-n} = I_o[\exp(vq/nkT) - 1],$$

where $I_{p-n}$ is the current flowing through the p-n junction, $I_o$ is the reverse saturation current, k is Boltzmann's constant, T is the absolute temperature in Kelvins, q is the magnitude of electronic charge, n is the ideality factor, and v is the voltage across the p-n junction. The reverse saturation current, $I_o$, and the ideality factor, n, are dependent on process parameters and on device geometry of the p-n junction, as known to one of ordinary skill in the art of electronics.

Figure 4:
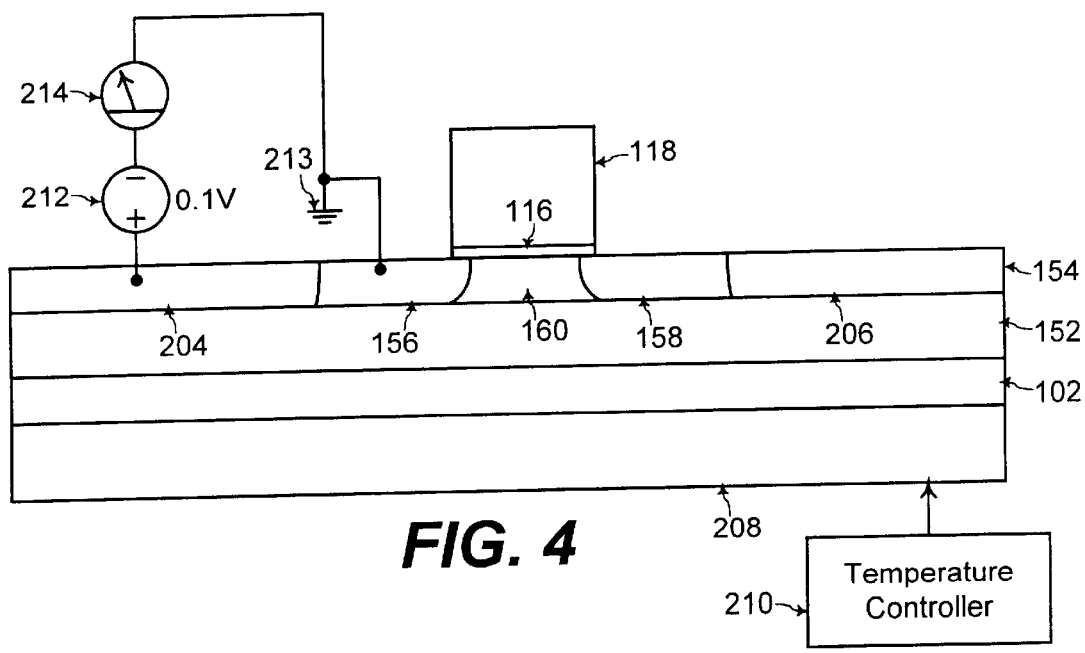
FIG. 4 shows a cross-sectional view of the MOSFET of FIG. 3 with bias across the p-n junction for determining a current versus temperature characteristic of the p-n junction, according to an embodiment of the present invention.

Referring to FIGS. 3 and 4, after implantation of the p-n junction dopant, the masking structure 202 is etched away. Processes for etching away the masking structure 202 comprised of photoresist material for example are known to one of ordinary skill in the art of integrated circuit fabrication. Referring to FIG. 4, for determining a current versus temperature characteristic of a p-n junction, a bias voltage from a p-n junction voltage source 212 is applied between the p-n junction formed by the first doped region 204 and the drain region 156. When the first doped region 204 is doped with a P-type dopant and the drain region 156 is doped with an N-type dopant, the drain junction 156 is coupled to a ground node 213, and the first doped region 204 is coupled to the positive terminal of the p-n junction voltage source 212. The negative terminal of the p-n junction voltage source 212 is coupled to the ground node 213. In this manner, the p-n junction formed by the first doped region 204 and the drain region 156 is forward biased. Voltage sources for generating DC voltages are known to one of ordinary skill in the art of electronics.

During operation of the MOSFET, the drain region 156 typically has higher bias voltage and a higher electric field than the source region 158. Therefore, the power dissipation near the drain region 156 is higher than near the source region 158. Thus, the current versus temperature characteristic of the p-n junction formed with the drain region 156 is determined. However, the present invention may also be practiced with determining the current versus temperature characteristic of the p-n junction formed with the source region 158.

Referring to FIG. 4, the bias voltage applied across the p-n junction of the first doped region 204 and the drain region 156 is about 0.1 Volts according to one embodiment of the present invention. The bias voltage applied across the p-n junction is relatively small in a range of from about 0.05 Volts to about 0.15 Volts such that the current flowing through the p-n junction is relatively small in the microamps range. Such a small current contributes an insignificant level of current to the MOSFET that operates with current levels in the milliamps range. The thermal resistance $R_{th}$ parameter is determined for the MOSFET operating with current levels in the milliamps range according to one embodiment of the present invention because the SHE (self-heating effect) with the MOSFET operating with current levels in the milliamps range may significantly affect operation of the MOSFET.

Further referring to FIG. 4, the semiconductor substrate 102 is placed on a wafer chuck 208 coupled to a temperature controller 210. The temperature controller 210 is coupled to the wafer chuck 208 to heat up the wafer chuck 208, and such a wafer chuck 208 with the temperature controller 210 is known to one of ordinary skill in the art of integrated circuit fabrication. In addition, a p-n junction current meter 214 is coupled between the p-n junction formed by the first doped region 204 and the drain region 156. The p-n junction current meter 214 measures the current level flowing through the p-n junction, and current meters for measuring current levels are known to one of ordinary skill in the art of electronics.

Figure 5:
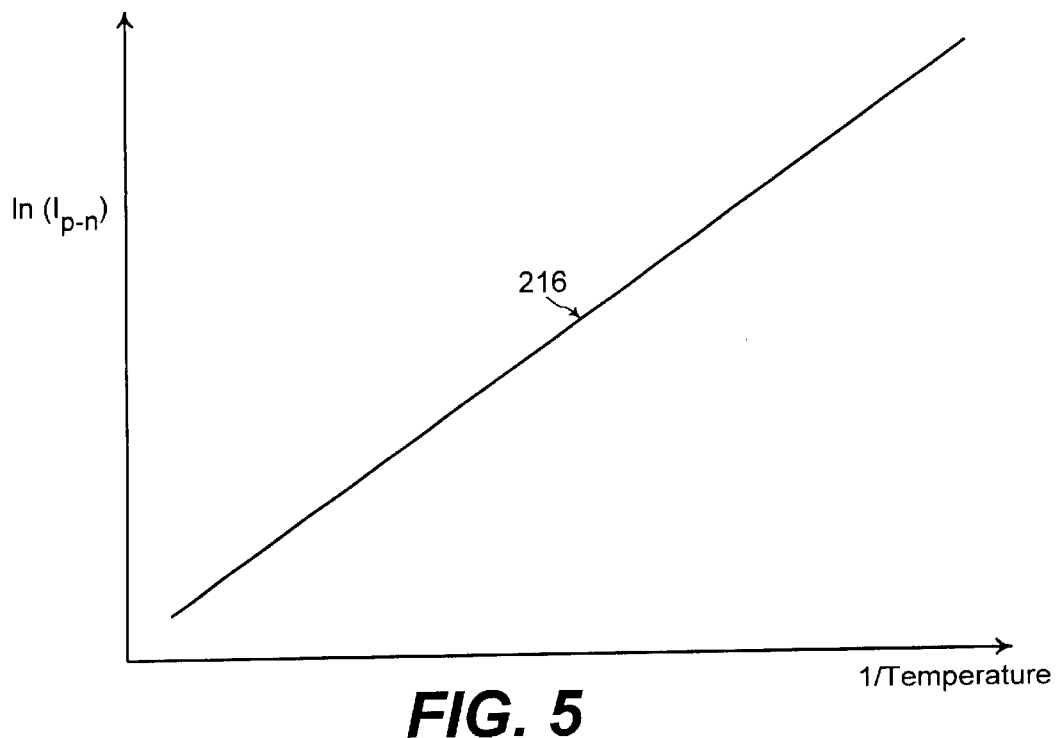
FIG. 5 shows an example current versus temperature characteristic of the p-n junction of FIG. 4.

Referring to FIGS. 4 and 5, the temperature controller 210 is used to vary the temperature of the wafer chuck 208 and thus the p-n junction formed by the first doped region 204 and the drain region 156. With the bias voltage of about 0.1 Volts applied across the p-n junction, the corresponding current level flowing through the p-n junction is measured with the current meter 214 for a plurality of temperatures of the p-n junction. The plurality of temperatures of the p-n junction is set by the temperature controller 210 of the wafer chuck 208. For each temperature of the p-n junction set by the temperature controller 210 of the wafer chuck 208, the resulting current level flowing through the p-n junction is measured with the p-n junction current meter 214.

Referring to FIG. 5, a p-n junction current versus temperature characteristic 216 is plotted as a graph. The graph of FIG. 5 has $\ln(I_{p-n})$, i.e., the natural logarithm of the current level flowing through the p-n junction, on the y-axis and the reciprocal of temperature (1/Temperature) on the x-axis. Because of the exponential equation of $I_{p-n}$ with the reciprocal of temperature as described herein, the graph 216 of $\ln(I_{p-n})$ versus the reciprocal of temperature is a straight line as shown in FIG. 5. The slope of the graph 216 of $\ln(I_{p-n})$ versus the reciprocal of temperature is dependent on the reverse saturation current, $I_o$, and the ideality factor, n, and thus on process parameters and on device geometry of the p-n junction.

Figure 6:
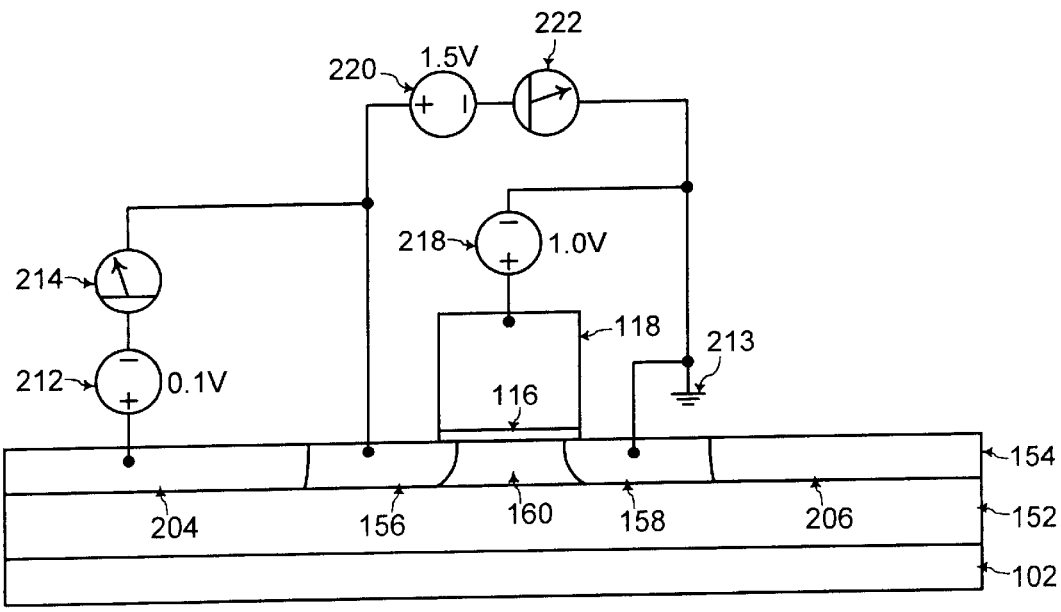
FIG. 6 shows a cross-sectional view of the MOSFET of FIG. 3 with bias voltages for the MOSFET having a first power dissipation level and with current meters for determining the temperature of the MOSFET at such a first power dissipation level, for an NMOSFET (N-channel Metal Oxide Semiconductor Field Effect Transistor) according to an embodiment of the present invention.

After determining the p-n junction current versus temperature characteristic 216, for determining the thermal resistance $R_{th}$ parameter for the MOSFET formed in SOI (semiconductor on insulator) technology, the MOSFET is biased to operate in the active region. Referring to FIG. 6, when the threshold voltage of the MOSFET is in a range of from about 0.25 Volts to about 0.7 Volts for example, a gate to source voltage of about 1.0 Volts is applied between the gate electrode 118 and the source region 158 by a gate to source voltage source 218, according to one embodiment of the present invention. The source region 158 is coupled to the ground node 213, and the gate electrode 118 is coupled to the positive terminal of the gate to source voltage source 218. The negative terminal of the gate to source voltage source 218 is coupled to the ground node 213. Voltage sources for generating DC voltages are known to one of ordinary skill in the art of electronics.

In addition, further referring to FIG. 6, a drain to source voltage of about 1.5 Volts is applied between the drain region 156 and the source region 158 by a drain to source voltage source 220, according to one embodiment of the present invention. The source region 158 is coupled to the ground node 213, and the drain region 156 is coupled to the positive terminal of the drain to source voltage source 220. The negative terminal of the drain to source voltage source 220 is coupled to the ground node 213. Voltage sources for generating DC voltages are known to one of ordinary skill in the art of electronics. A drain to source current meter 222 is coupled between the drain region 156 and the source region 158 for measuring the current level flowing through the drain region 156 and the source region 158. Current meters for measuring current levels are known to one of ordinary skill in the art of electronics.

Figure 8:
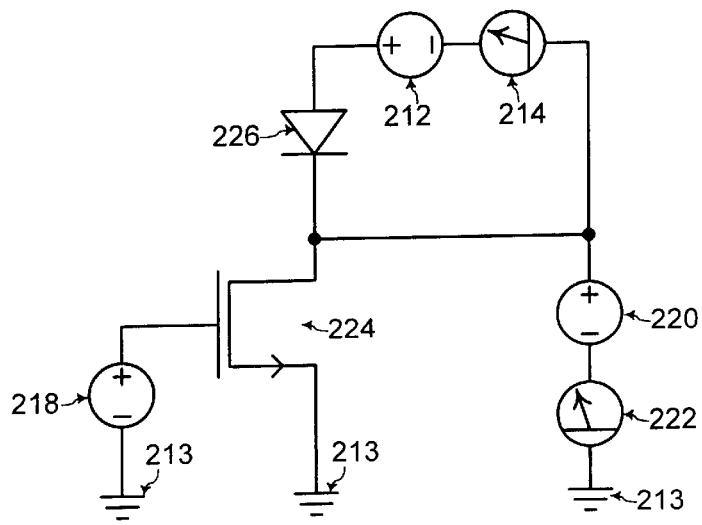
FIG. 8 shows a circuit diagram of the MOSFET for FIGS. 6 and 7, according to an embodiment of the present invention.

FIG. 8 shows a circuit diagram of the MOSFET 224 of FIG. 6. The diode 226 in FIG. 8 is the p-n junction formed by the first doped region 204 and the drain region 156. Elements having the same reference number in FIGS. 6 and 8 refer to elements having similar structure and function. With such bias on the MOSFET, a first current level flowing through the drain region 156 and the source region 158 of the MOSFET is measured by the drain to source current meter 222. A first power dissipation level, $W_1$, of the MOSFET is then determined by multiplying such a measured first current level and the drain to source voltage of 1.5 Volts.

Furthermore, the p-n junction voltage source 212 maintains the bias voltage across the p-n junction formed by the first doped region 204 and the drain region 156 to be 0.1 Volts. As the MOSFET has the first power dissipation level, $W_1$, a first temperature $T_1$ of the MOSFET is determined by the temperature of the p-n junction formed by the first doped region 204 and the drain region 156. With the bias voltage of 0.1 Volts applied between the p-n junction, a first p-n junction current level flowing through the p-n junction formed by the first doped region 204 and the drain region 156 is measured by the p-n junction current meter 214. By referring to the p-n junction current versus temperature characteristic 216 of FIG. 5, the temperature corresponding to such a measured first p-n junction current level is the temperature of the p-n junction. In this manner, the corresponding temperature $T_1$ of the MOSFET is determined for the first power dissipation level, $W_1$.

Figure 1:
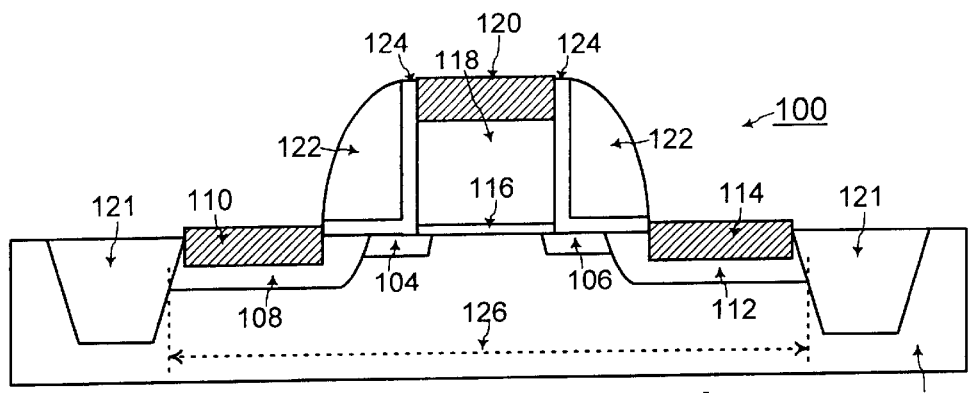
FIG. 1 shows a cross-sectional view of a conventional MOSFET (Metal Oxide Semiconductor Field Effect Transistor) fabricated within a bulk semiconductor substrate, according to the prior art.
Figure 7:
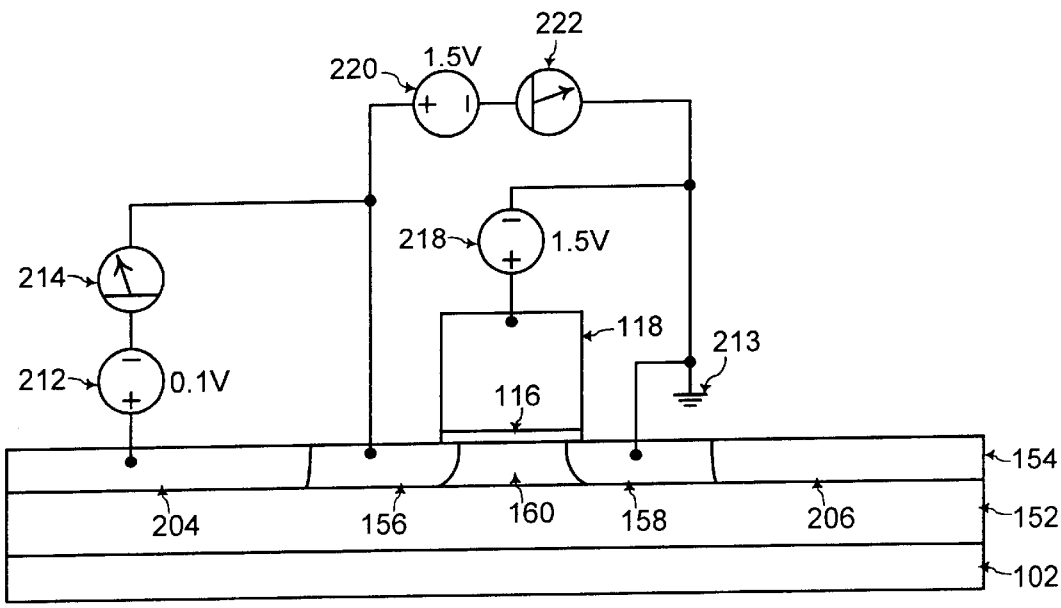
FIG. 7 shows a cross-sectional view of the MOSFET of FIG. 3 with bias voltages for the MOSFET having a second power dissipation level and with current meters for determining the temperature of the MOSFET at such a second power dissipation level, for the NMOSFET (N-channel Metal Oxide Semiconductor Field Effect Transistor) according to an embodiment of the present invention.

For determining the thermal resistance $R_{th}$ parameter for the MOSFET, referring to FIG. 7, the MOSFET is biased to dissipate a second power dissipation level, $W_2$. In one embodiment of the present invention, comparing FIGS. 6 and 7, the gate to source voltage is changed from 1.0 Volts in FIG. 6 to 1.5 Volts in FIG. 7. With such higher gate to source voltage in FIG. 7, the drain to source current increases such that the second power dissipation level, $W_2$, is higher. With such bias on the MOSFET, a second current level flowing through the drain region 156 and the source region 158 of the MOSFET is measured by the drain to source current meter 222. The second power dissipation level, $W_2$, of the MOSFET is then determined by multiplying such a measured second current level and the drain to source voltage of 1.5 Volts.

Furthermore, the p-n junction voltage source 212 maintains the bias voltage across the p-n junction formed by the first doped region 204 and the drain region 156 to be 0.1 Volts. As the MOSFET has the second power dissipation level, $W_2$, a second temperature $T_2$ of the MOSFET is determined by the temperature of the p-n junction formed by the first doped region 204 and the drain region 156. With the bias voltage of 0.1 Volts applied between the p-n junction, a second p-n junction current level flowing through the p-n junction formed by the first doped region 204 and the drain region 156 is measured by the p-n junction current meter 214 as the MOSFET has the second power dissipation level, $W_2$. By referring to the p-n junction current versus temperature characteristic 216 of FIG. 5, the temperature corresponding to such a measured second p-n junction current level is the temperature of the p-n junction. In this manner, the corresponding temperature $T_2$ of the MOSFET is determined for the second power dissipation level, $W_2$. The temperature of the p-n junction is assumed to be substantially same as the temperature of the MOSFET and the layer of semiconductor material 154 since the thermal conductance of the layer of semiconductor material 154 which is comprised of silicon for example is relatively high (100 times higher than the buried insulating layer 152 comprised of silicon dioxide $SiO_2$ for example).

With the corresponding temperatures $T_1$ and $T_2$ of the MOSFET determined for each of the first and second power dissipation levels, $W_1$ and $W_2$, the thermal resistance $R_{th}$ is determined to be the rate of change in temperature of the layer of semiconductor material 154, $\Delta T$, with respect to the rate of change in power dissipation, $\Delta W$, by the MOSFET, as follows:

$$R_{th}=\Delta T/\Delta W=(T_1-T_2)/(W_1-W_2).$$

In this manner, the p-n junction is biased with a DC bias voltage, and the MOSFET is biased at various DC bias voltages. Thus, the thermal resistance $R_{th}$ parameter for the MOSFET formed in SOI (semiconductor on insulator) technology is determined by using simple DC bias voltages such that the thermal resistance $R_{th}$ parameter is determined in a relatively easy manner.

Figure 12:
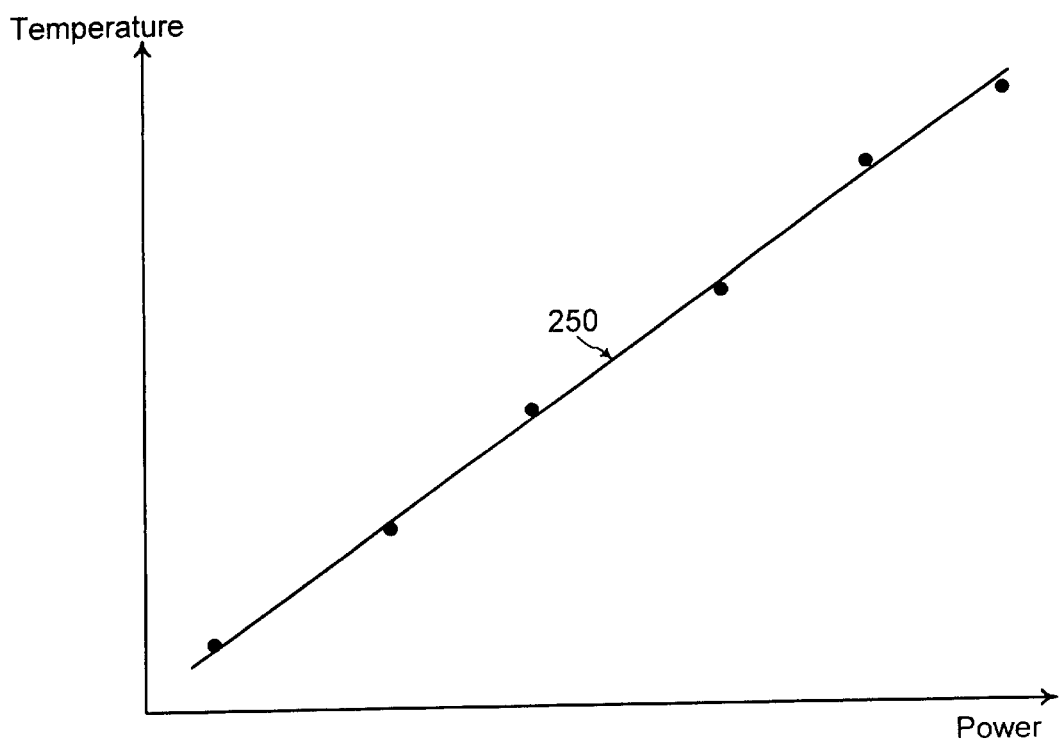
FIG. 12 shows a linear regression for a plurality of data points of temperature versus power dissipation for determining the thermal resistance $R_{th}$ parameter for the field effect transistor.

In another embodiment of the present invention, referring to FIG. 12, a respective temperature of the p-n junction may be determined for a plurality of power dissipation levels aside from the examples of the two temperatures $T_1$ and $T_2$ for each of the first and second power dissipation levels, $W_1$ and $W_2$. Referring to FIG. 12, linear regression may be performed to form a linear plot 250 that optimally fits through the data-points of such respective temperature of the p-n junction for each of the plurality of power dissipation levels. Linear regression techniques to generate such a linear plot 250 are known to one of ordinary skill in the art of electronics. The thermal resistance $R_{th}$ parameter is the slope of the linear plot 250 that indicates the rate of change of temperature with respect to rate of change of power dissipation.

The foregoing is by way of example only and is not intended to be limiting. For example, the p-n junction formed by the drain region 156 is used in an embodiment of the present invention when the MOSFET is an NMOSFET (N-channel Metal Oxide Semiconductor Field Effect Transistor). Referring to FIGS. 5 and 6, a higher level of power may be dissipated for the NMOSFET near the drain region 156 since the drain region 156 is coupled to 1.5 Volts and since the source region 158 is coupled to the ground node 213. Thus, the p-n junction formed by the drain region 156 is used for determining the temperature of the NMOS- FET because the electric field at the drain region 156 is higher than at the source region 158. However, the present invention may also be practiced with the p-n junction formed by the source region 158 as would be apparent to one of ordinary skill in the art of electronics from the description herein.

Furthermore, the present invention may be practiced for determining the thermal resistance $R_{th}$ parameter for a PMOSFET (P-channel Metal Oxide Semiconductor Field Effect Transistor). In that case, referring to FIG. 3, the drain region 156 and the source region 158 are doped with a P-type dopant such as boron for example, and the p-n junction dopant is an N-type dopant such as phosphorous or arsenic for example such that the first doped region 204 and the second doped region 206 are doped with the N-type dopant.

Figure 9:
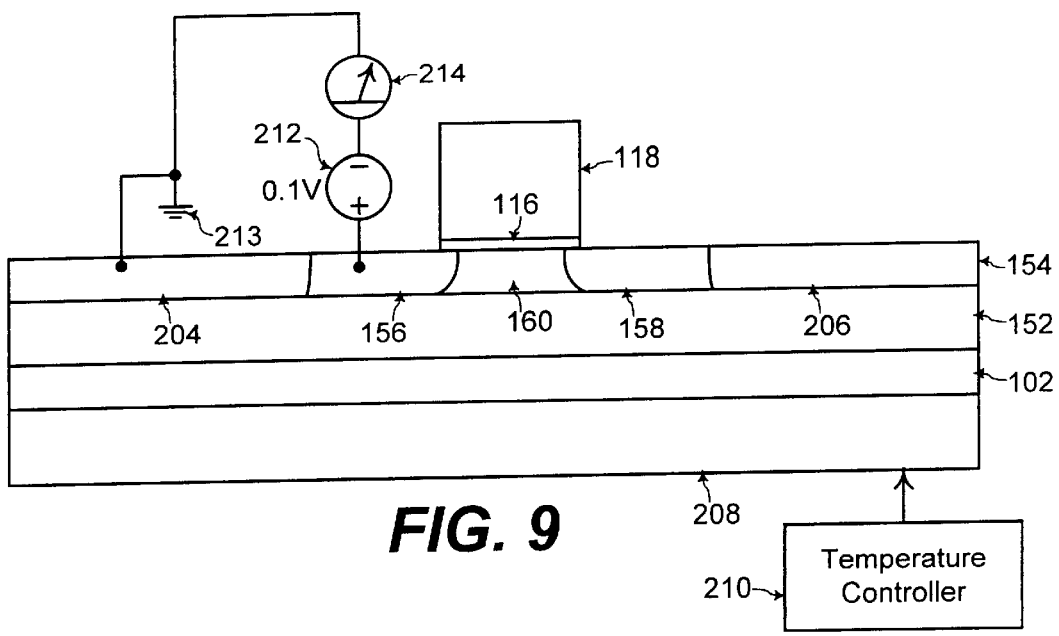
FIG. 9 shows a cross-sectional view of the MOSFET of FIG. 3 with bias across the p-n junction for determining a current versus temperature characteristic of the p-n junction, for a PMOSFET (P-channel Metal Oxide Semiconductor Field Effect Transistor) according to an embodiment of the present invention.

Referring to FIG. 9, for the PMOSFET, the drain region 156 typically has a higher electric field than the source region 158 during operation of the PMOSFET because the voltage difference between the drain region 156 and the channel region 160 is higher than between the source region 158 and the channel region 160. Thus, the current versus temperature characteristic is determined for the p-n junction formed by the first doped region 204 and the drain region 156 in a similar manner as described for the current versus temperature characteristic 216 of FIG. 5, using the p-n junction voltage source 212, the p-n junction current meter 214, and the temperature controller 210 of the wafer chuck 208.

Figure 10:
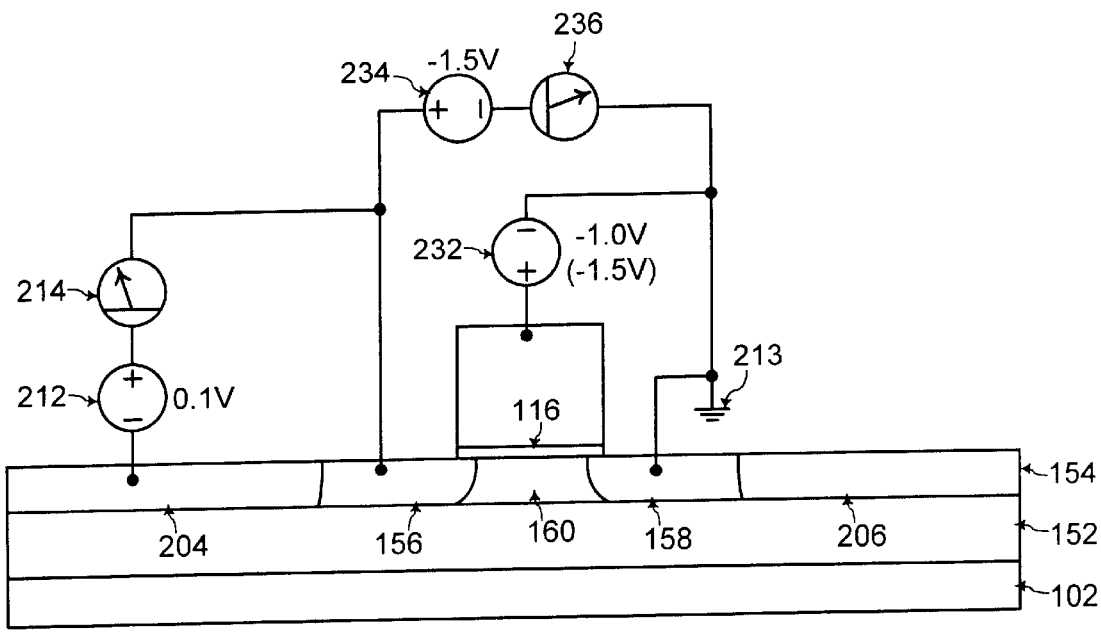
FIG. 10 shows a cross-sectional view of the MOSFET of FIG. 3 with bias voltages for the MOSFET having a plurality of power dissipation levels and with current meters for determining the respective temperature of the MOSFET at each of such plurality of power dissipation levels, for a PMOSFET (P-channel Metal Oxide Semiconductor Field Effect Transistor) according to an embodiment of the present invention.
Figure 11:
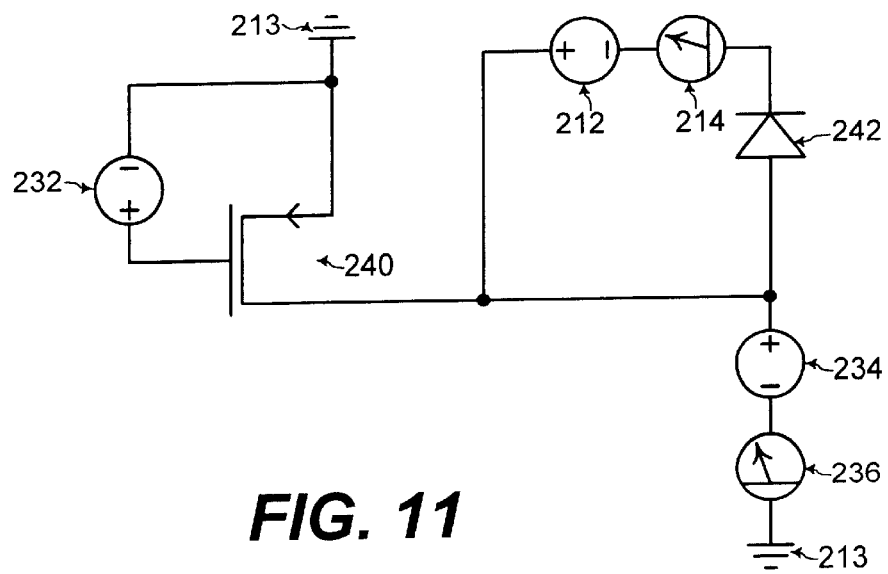
FIG. 11 shows a circuit diagram of the MOSFET of FIG. 10, according to an embodiment of the present invention.

Referring to FIG. 10, the PMOSFET is biased to operate in the active region when a gate to source voltage of about −1.0 Volts is applied between the gate electrode 118 and the source region 158 with a gate to source voltage source 232 and when a drain to source voltage of about −1.5 Volts is applied between the drain region 156 and the source region 158 by a drain to source voltage source 234. FIG. 11 shows a circuit diagram of the PMOSFET 240 of FIG. 10. The diode 242 in FIG. 11 is the p-n junction formed by the drain region 156 and the first doped region 204. Elements having the same reference number in FIGS. 10 and 11 refer to elements having similar structure and function. With such bias on the PMOSFET, a first current level flowing through the drain region 156 and the source region 158 of the PMOSFET is measured by a drain to source current meter 236. The first power dissipation level, $W_1$, of the PMOSFET is then determined by multiplying such a measured first current level and the drain to source voltage of −1.5 Volts.

Furthermore, the p-n junction voltage source 212 maintains the bias voltage across the p-n junction formed by the drain region 156 and the first doped region 204 to be 0.1 Volts. As the PMOSFET has the first power dissipation level, $W_1$, a first temperature $T_1$ of the PMOSFET is determined by the temperature of the p-n junction formed by the drain region 156 and the first doped region 204. With the bias voltage of 0.1 Volts applied between the p-n junction, a first p-n junction current level flowing through the p-n junction formed by the drain region 156 and the first doped region 204 is measured by the p-n junction current meter 214. By referring to the p-n junction current versus temperature characteristic (similar to 216 of FIG. 5), the temperature corresponding to such a measured first p-n junction current level is the temperature of the p-n junction. In this manner, the corresponding temperature $T_1$ of the PMOSFET is determined for the first power dissipation level, $W_1$.

The PMOSFET is then biased to dissipate a second power dissipation level, $W_2$. In one embodiment of the present invention, the gate to source voltage is changed from −1.0 Volts to −1.5 Volts. With such higher magnitude of gate to source voltage in FIG. 10, the drain to source current magnitude increases such that the second power dissipation level, $W_2$, is higher. With such bias on the PMOSFET, a second current level flowing through the source region 158 and the drain region 156 of the PMOSFET is measured by the drain to source current meter 236. The second power dissipation level, $W_2$, of the PMOSFET is then determined by multiplying such a measured second current level and the drain to source voltage of −1.5 Volts.

Furthermore, the p-n junction voltage source 212 maintains the bias voltage across the p-n junction formed by the drain region 156 and the first doped region 204 to be 0.1 Volts. As the PMOSFET has the second power dissipation level, $W_2$, a second temperature $T_2$ of the PMOSFET is determined by the temperature of the p-n junction formed by the drain region 156 and the first doped region 204. With the bias voltage of 0.1 Volts applied between the p-n junction, a second p-n junction current level flowing through the p-n junction formed by the drain region 156 and the first doped region 204 is measured by the p-n junction current meter 214 as the PMOSFET has the second power dissipation level, $W_2$. By referring to the p-n junction current versus temperature characteristic (similar to 216 of FIG. 5), the temperature corresponding to such a measured second p-n junction current level is the temperature of the p-n junction. In this manner, the corresponding temperature $T_2$ of the PMOSFET is determined for the second power dissipation level, $W_2$.

With the corresponding temperatures $T_1$ and $T_2$ of the PMOSFET determined for each of the first and second power dissipation levels, $W_1$ and $W_2$, the thermal resistance $R_{th}$ is determined to be the rate of change in temperature of the layer of semiconductor material 154, $\Delta T$, with respect to the rate of change in power dissipation, $\Delta W$, by the PMOSFET, as follows:

$$R_{th}=\Delta T/\Delta W=(T_1-T_2)/(W_1-W_2).$$

In another embodiment of the present invention, referring to FIG. 12, a respective temperature of the p-n junction may be determined for a plurality of power dissipation levels for the PMOSFET aside from the examples of the two temperatures $T_1$ and $T_2$ for each of the first and second power dissipation levels, $W_1$ and $W_2$. Referring to FIG. 12, linear regression may be performed to form a linear plot 250 that optimally fits through the data-points of such respective temperature of the p-n junction for each of the plurality of power dissipation levels for the PMOSFET. Linear regression techniques to generate such a linear plot 250 are known to one of ordinary skill in the art of electronics. The thermal resistance $R_{th}$ parameter is the slope of the linear plot 250 that indicates the rate of change of temperature with respect to rate of change of power dissipation.

In addition, any specified material or any specified voltage levels described herein is by way of example only. Furthermore, other voltage levels and current levels may be used for practicing the present invention, as would be apparent to one of ordinary skill in the art of electronics from the description herein.

The present invention is limited only as defined in the following claims and equivalents thereof.

We claim:

1. A system for determining thermal resistance of a field effect transistor, comprising:
   a p-n junction formed with one of drain and source regions of the transistor for determining a current versus temperature characteristic of the p-n junction; and means for determining a respective temperature for each of a plurality of power dissipation levels for the transistor from the current versus temperature characteristic)
wherein the thermal resistance of the transistor is a rate of change of the temperature with respect to a rate of change of the power dissipation level.

2. The system of claim 1, wherein the transistor is formed with a semiconductor film on a buried insulating material.

3. The system of claim 1, further comprising:
means for determining the current versus temperature characteristic of the p-n junction.

4. The system of claim 3, wherein the means for determining the current versus temperature characteristic includes:
a p-n junction voltage source for biasing the p-n junction at a bias voltage;
a wafer heating chuck for heating the p-n junction to a plurality of temperatures; and
a p-n junction current meter for measuring a current conducted through the p-n junction at each of the plurality of temperatures to generate the current versus temperature characteristic.

5. The system of claim 4, wherein the bias voltage of the p-n junction is in a range of from about 0.05 Volts to about 0.15 Volts.

6. The system of claim 1, further comprising:
means for measuring the plurality of power dissipation levels through the transistor.

7. The system of claim 6, wherein the means for measuring the plurality of power dissipation levels through the transistor includes:
a drain to source voltage source and a gate to source voltage source for biasing the transistor; and
a drain to source current meter for measuring a drain to source current of the transistor,
wherein a power dissipation level is determined by multiplying a drain to source current level with a drain to source bias voltage.

8. The system of claim 7, further comprising:
a p-n junction voltage source for biasing the p-n junction at a bias voltage; and
a p-n junction current meter for measuring a respective current flowing through the p-n junction as the transistor is dissipating each of a plurality of power dissipation levels,
wherein a respective temperature of the p-n junction is determined from the measured respective current and the current versus temperature characteristic for each of the plurality of power dissipation levels, and
wherein the respective temperature of the p-n junction is the respective temperature of the transistor for each of the plurality of power dissipation levels.

9. The system of claim 7, wherein a first power dissipation level is determined with the transistor having the drain to source bias voltage of about 1.5 Volts, and a gate to source bias voltage of about 1.0 Volts.

10. The system of claim 9, wherein a second power dissipation level is determined with the transistor having the drain to source bias voltage of about 1.5 Volts, and a gate to source bias voltage of about 1.5 Volts.

11. The system of claim 1, wherein the p-n junction is formed with one of the drain and source regions having a higher electric field during operation of the transistor.

12. The system of claim 1, wherein the transistor is an NMOSFET (N-channel Metal Oxide Semiconductor Field Effect Transistor), and wherein the p-n junction is formed with the drain region having an N-type dopant and with a P-type dopant implanted adjacent the drain region.

13. The system of claim 12, wherein the transistor is a PMOSFET (P-channel Metal Oxide Semiconductor Field Effect Transistor), and wherein the p-n junction is formed with the drain region having a P-type dopant and with an N-type dopant implanted adjacent the drain region.

14. A system for determining thermal resistance of a field effect transistor formed with a semiconductor film on a buried insulating material in SOI (semiconductor on insulator) technology, the field effect transistor having a drain region and a source region, the system comprising:
a p-n junction formed with at least one of the drain region or the source region;
a p-n junction voltage source for biasing the p-n junction at a bias voltage;
a wafer heating chuck for heating the p-n junction to a plurality of temperatures;
a p-n junction current meter for measuring a current conducted through the p-n junction at each of the plurality of temperatures of the p-n junction to generate a current versus temperature characteristic for the p-n junction;
a drain to source voltage source and a gate to source voltage source for biasing the field effect transistor to dissipate a power dissipation level; and
a drain to source current meter for measuring a drain to source current of the field effect transistor,
wherein the p-n junction current meter measures a respective current flowing through the p-n junction as the field effect transistor is dissipating each of a plurality of power dissipation levels and with the p-n junction being biased by the p-n junction voltage source at the bias voltage; wherein a respective temperature of the p-n junction is determined from the measured respective current and the current versus temperature characteristic for each of the plurality of power dissipation levels,
and wherein the thermal resistance is determined to be a rate of change of the temperature of the p-n junction with respect to a rate of change of the power dissipation level.

* * * * *